US012666903B2

(12) United States Patent
Matsushita et al.

(10) Patent No.: US 12,666,903 B2
(45) Date of Patent: Jun. 23, 2026

(54) WAFER SUPPORT TABLE

(71) Applicant: NGK INSULATORS, LTD.,
Nagoya-City (JP)

(72) Inventors: Ryohei Matsushita, Yokkaichi-City
(JP); Yuji Akatsuka, Handa-City (JP)

(73) Assignee: NGK INSULATORS, LTD., Nagoya
(JP)

( * ) Notice: Subject to any disclaimer, the term of this
patent is extended or adjusted under 35
U.S.C. 154(b) by 1038 days.

(21) Appl. No.: 17/577,599

(22) Filed: Jan. 18, 2022

(65) Prior Publication Data

US 2022/0254662 A1      Aug. 11, 2022

(30) Foreign Application Priority Data

Feb. 5, 2021      (JP) ................................ 2021-017029

(51) Int. Cl.
H10P 72/00         (2026.01)
H05B 3/03          (2006.01)
(Continued)

(52) U.S. Cl.
CPC ........... H10P 72/0432 (2026.01); H05B 3/03
(2013.01); H05B 3/10 (2013.01); H05B 3/265
(2013.01);
(Continued)

(58) Field of Classification Search
CPC ...... H05B 3/26; H05B 3/06; H05B 2203/005;
H05B 1/0233; H05B 3/20; H05B
2203/007; H01L 21/67103
See application file for complete search history.

(56) References Cited

U.S. PATENT DOCUMENTS 3,835,290 A * 9/1974 Peters ................... H01F 7/0236
219/205
7,189,946 B2 * 3/2007 Goto ................. H01L 21/67103
219/544
(Continued)

FOREIGN PATENT DOCUMENTS

JP         2003-123943 A       4/2003
JP         2018-056332 A       4/2018
(Continued)

OTHER PUBLICATIONS

Japanese Office Action (with English translation) dated Aug. 22,
2023 (Application No. 2021-017029).
(Continued)

*Primary Examiner* — Steven W Crabb
*Assistant Examiner* — Fahmida Ferdousi
(74) *Attorney, Agent, or Firm* — Muncy, Geissler, Olds &
Lowe, P.C.

(57)                ABSTRACT

A wafer support table includes a ceramic base having a
wafer placement surface, and a plurality of heaters embed-
ded in the ceramic base. The ceramic base has a first heater
formation surface, a second heater formation surface, and a
third heater formation surface in a stated order from the
wafer placement surface toward a surface opposite from the
wafer placement surface. A first heater is provided on the
first heater formation surface so as to be located at a center
of the ceramic base. A second heater is provided on the
second heater formation surface so as to be located around
a periphery of the first heater. A third heater is provided on
the third heater formation surface so as to overlap the second
heater and is provided in each of a plurality of zones divided
from the third heater formation surface by a radial line
segment.

5 Claims, 3 Drawing Sheets

(51) Int. Cl.

| | |
|---|---|
| *H05B 3/10* | (2006.01) |
| *H05B 3/26* | (2006.01) |
| *H05B 3/28* | (2006.01) |
| *H10P 72/76* | (2026.01) |

(52) U.S. Cl.

CPC ......... *H05B 3/283* (2013.01); *H10P 72/7604* (2026.01); *H10P 72/7624* (2026.01); *H05B 2203/007* (2013.01); *H05B 2203/014* (2013.01); *H05B 2203/017* (2013.01)

(56) References Cited

U.S. PATENT DOCUMENTS

| | | | | |
|---|---|---|---|---|
| 9,888,528 | B2 * | 2/2018 | Matsushita | H05B 3/26 |
| 10,388,560 | B2 * | 8/2019 | Takebayashi | H01L 21/68757 |
| 10,440,777 | B2 * | 10/2019 | Zhang | H05B 1/0233 |
| 11,562,913 | B2 * | 1/2023 | Smith | H01L 21/67103 |
| 2003/0071032 | A1 | 4/2003 | Yamaguchi et al. | |
| 2013/0161305 | A1 * | 6/2013 | Ptasienski | H01L 21/67109 |
| | | | | 219/508 |
| 2016/0329231 | A1 * | 11/2016 | Parkhe | H01L 21/67248 |
| 2018/0090349 | A1 | 3/2018 | Kurano | |
| 2018/0218885 | A1 | 8/2018 | Maeda et al. | |

FOREIGN PATENT DOCUMENTS

| | | | | |
|---|---|---|---|---|
| JP | 6758143 | B2 | 9/2020 | |
| KR | 10-0495987 | B1 | 6/2005 | |
| KR | 10-2018-0035712 | A | 4/2018 | |
| KR | 10-2020-0067241 | A | 6/2020 | |
| WO | WO-2019008889 | A1 * | 1/2019 | C23C 14/50 |

OTHER PUBLICATIONS

Korean Office Action (Application No. 10-2022-0006976) dated Dec. 1, 2023 (with English translation) (12 pages).

* cited by examiner

Fig. 3

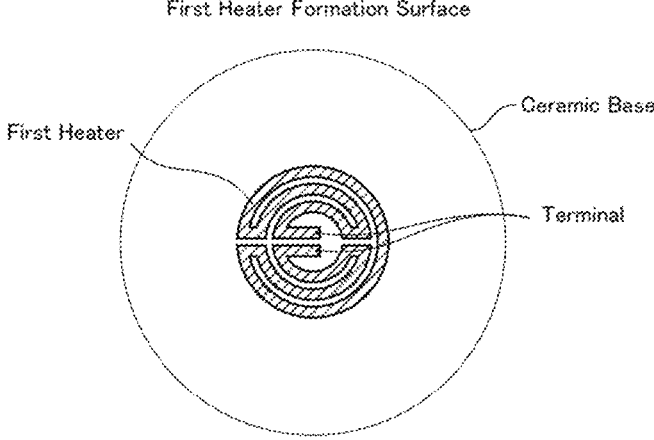

First Heater Formation Surface

First Heater

Ceramic Base

Terminal

Fig. 4

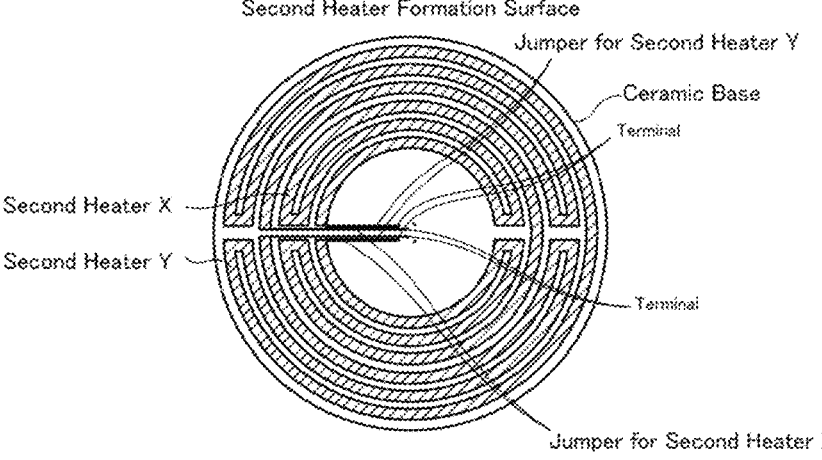

Second Heater Formation Surface

Jumper for Second Heater Y

Ceramic Base

Terminal

Second Heater X

Second Heater Y

Terminal

Jumper for Second Heater X

Fig. 5

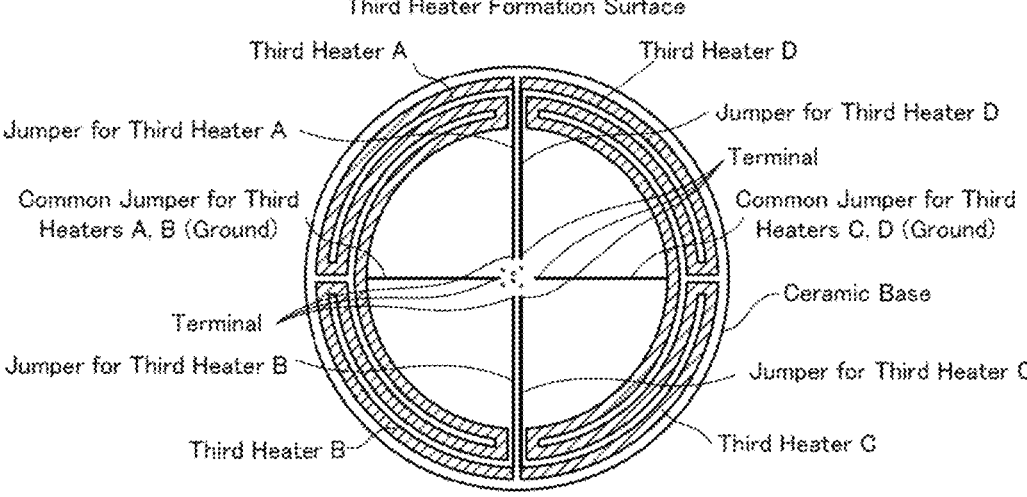

Third Heater Formation Surface

Third Heater A

Third Heater D

Jumper for Third Heater A

Jumper for Third Heater D

Terminal

Common Jumper for Third
Heaters A, B (Ground)

Common Jumper for Third
Heaters C, D (Ground)

Ceramic Base

Terminal

Jumper for Third Heater B

Jumper for Third Heater C

Third Heater B

Third Heater C

WAFER SUPPORT TABLE

BACKGROUND OF THE INVENTION

1. Field of the Invention

The present invention relates to a wafer support table.

2. Description of the Related Art

Hitherto, there is known a ceramic wafer support table that is used when a deposition process using plasma CVD, or the like is applied to a wafer and in which multilayer heaters used to heat the wafer are disposed. For example, Patent Literature 1 describes electrically isolated multilayer heaters.

CITATION LIST

Patent Literature

PTL 1: JP 6758143 B

SUMMARY OF THE INVENTION

However, such a wafer support table is capable of preventing a decrease in the temperature of a central part due to heat extraction from a shaft, but there are concerns that thermal uniformity deteriorates due to influences from around the periphery of the wafer support table.

The present invention is made to solve such a problem, and it is a main object to improve thermal uniformity at an outer peripheral part of a wafer.

A wafer support table of the present invention includes a ceramic base having a wafer placement surface, and a plurality of heaters embedded in the ceramic base. The ceramic base has a first heater formation surface, a second heater formation surface, and a third heater formation surface in a stated order from the wafer placement surface toward a surface opposite from the wafer placement surface. The plurality of heaters includes a first heater provided on the first heater formation surface, a second heater provided on the second heater formation surface, and a third heater provided on the third heater formation surface. The first heater is provided so as to be located at a center of the ceramic base. The second heater is provided so as to be located around a periphery of the first heater. The third heater is provided so as to overlap the second heater and is provided in each of a plurality of zones divided from the third heater formation surface by a radial line segment.

With the wafer support table of the present invention, the third heater is provided in each of the plurality of zones divided from the third heater formation surface by a radial line segment, so it is possible to individually control the temperatures of the plurality of third heaters. Thus, it is possible to suppress influences on thermal uniformity due to a peripheral part factor. By embedding the first heater further close to the wafer placement surface different from the other heater formation surfaces, jumper wires of the other heaters do not pass through the first heater, so design flexibility of the first heater increases and thermal uniformity improves.

BRIEF DESCRIPTION OF THE DRAWINGS

FIG. 3 is a plan view of a first heater formation surface of a ceramic base.

FIG. 4 is a plan view of a second heater formation surface of the ceramic base.

FIG. 5 is a plan view of a third heater formation surface of the ceramic base.

DETAILED DESCRIPTION OF THE INVENTION

Figure 1:
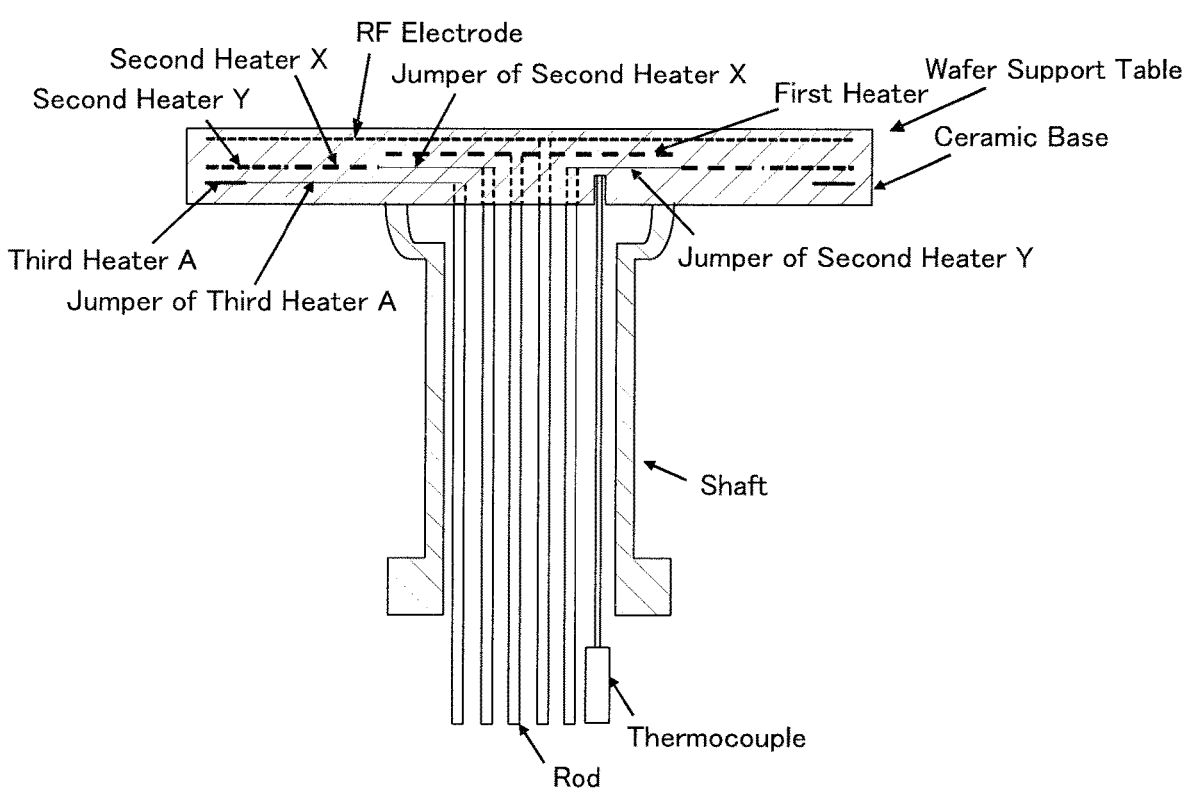
FIG. 1 is a vertical cross-sectional view taken along a center of the ceramic base of a wafer support table used in a plasma generating apparatus.
Figure 2:
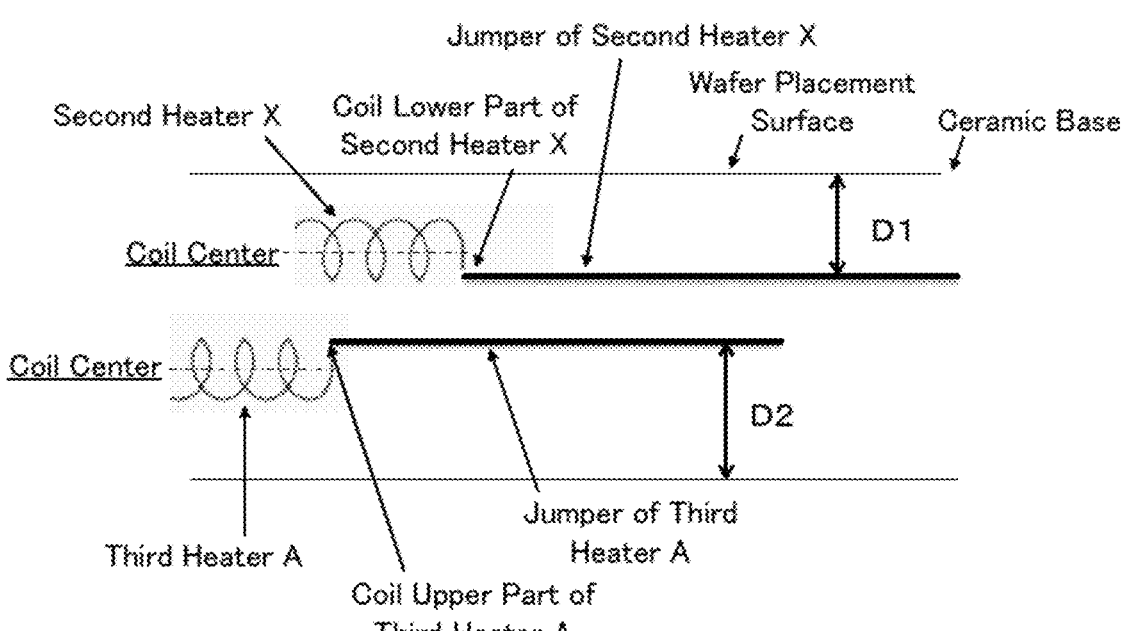
FIG. 2 is a view illustrating the relation between coil-shaped heaters and jumpers.

A preferred embodiment of the present invention will be described below with reference to the drawings. FIG. 1 is a cross-sectional view of a wafer support table used in a plasma generating apparatus. FIG. 2 is a view illustrating the relation between coil-shaped heaters and jumpers. FIG. 3 to FIG. 5 are plan views of first to third heater formation surfaces of a ceramic base. In FIG. 3 to FIG. 5, coil-shaped heaters are hatched.

A wafer support table includes a ceramic base having a wafer placement surface, a plurality of heaters embedded in the ceramic base, and a cylindrical shaft provided on a surface opposite from the wafer placement surface of the ceramic base.

The ceramic base has a first heater formation surface, a second heater formation surface, and a third heater formation surface in a stated order from the wafer placement surface toward the surface opposite from the wafer placement surface.

The plurality of heaters includes a first heater provided on the first heater formation surface, a second heater (second heaters X, Y) provided on the second heater formation surface, and a third heater (third heaters A to D) provided on the third heater formation surface. The first heater is provided so as to be located at a center of the ceramic base.

The first heater is formed by routing a coil so as to extend from one terminal to the other terminal in a one-stroke pattern.

The second heater includes the second heater X provided on the inner side of the second heater formation surface and the second heater Y provided on the outer side of the second heater formation surface. The second heaters X, Y both are provided so as to be located around the periphery of the first heater. The second heater X is formed by extending a jumper for the second heater X from one terminal to outside the first heater, routing a coil in a one-stroke pattern, and drawing the other jumper for the second heater X into the center-side other terminal. The second heater Y is formed by extending a jumper for the second heater Y from one terminal to outside the second heater X, routing a coil in a one-stroke pattern, and drawing the other jumper for the second heater Y into the center-side other terminal. The jumpers for the second heaters X, Y are provided on the second heater formation surface. In other words, the jumpers for the second heaters X, Y are formed on the same plane as the second heaters X, Y. The same plane just needs to be a plane that overlaps the second heaters X, Y in height. When, for example, the second heaters X, Y have a coil shape, the range between a coil top closest to the wafer placement surface and a coil bottom farthest from the wafer placement surface is regarded as the same plane (hereinafter, the same applies).

The third heater includes the four third heaters A to D. The third heaters A to D are respectively provided in a plurality of (four in FIG. 5) zones divided from the third heater formation surface by a radial line segment and each overlap the second heater in plan view. Here, the third heater A and the third heater B are integrated. Specifically, the third heater A is formed by extending a jumper for the third heater A from one terminal to the outside and routing a coil in a one-stroke pattern to reach a connection portion of a common jumper for the third heaters A, B (being connected to a ground terminal). The third heater B is formed by routing a coil in a one-stroke pattern from the connection portion and drawing a jumper for the third heater B into the center-side other terminal. The third heater C and the third heater D are integrated. Specifically, the third heater C is formed by extending a jumper for the third heater C from one terminal to the outside and routing a coil in a one-stroke pattern to reach a connection portion of a common jumper for the third heaters C, D (being connected to the ground terminal). The third heater D is formed by routing a coil in a one-stroke pattern from the connection portion and drawing a jumper for the third heater D into the center-side other terminal. The jumpers for the third heaters A, B, the common jumper for the third heaters A, B, the jumpers for the third heaters C, D, and the common jumper for the third heaters C, D all are provided on the third heater formation surface as in the case of the third heaters A to D, that is, these jumpers are formed in the same plane as the third heaters A to D.

The ceramic base has terminal holes extending from the surface opposite from the wafer placement surface toward the terminals respectively associated with the first heater, the second heater (the second heaters X, Y), and the third heater (the third heaters A to D). The terminal holes associated with the first heater, the second heater (the second heaters X, Y), and the third heater (the third heaters A to D) are deeper in proportion to the depths of the associated heaters.

The first heater, the second heater (the second heaters X, Y), and the third heater (the third heaters A to D) have a coil shape as described above. The jumpers for the second heater are connected to a coil lower part located adjacent to a surface of the coil of the second heater, opposite from the wafer placement surface. The jumpers for the third heater are connected to a coil upper part located on a wafer placement surface side of the coil of the third heater.

The ceramic base has an RF electrode disposed closer to the wafer placement surface than the first heater. A rod that supplies electricity to the first heater, a rod that supplies electricity to the second heater (the second heaters X, Y), a rod that supplies electricity to the third heater (the third heaters A to D), and a rod connected to the RF electrode respectively have parts protruding from the shaft with the same length.

The second heater is provided in each of a plurality of (here, two) zones divided from the second heater formation surface by a boundary concentric with the ceramic base.

With the wafer support table of the present embodiment described above, the plurality of zones divided from the third heater formation surface by a radial line segment respectively have the third heaters A to D, so it is possible to individually control the temperatures of the plurality of third heaters A to D. Thus, it is possible to suppress influences on thermal uniformity due to an outer peripheral part factor. By embedding the first heater further close to the wafer placement surface different from the other heater formation surfaces, jumper wires of the other heaters do not pass through the first heater, so design flexibility of the first heater increases and thermal uniformity improves.

Since the annular second heaters and the fan-shaped third heaters overlap each other, further precise temperature control is possible.

The terminal holes associated with the first heater, the second heater (the second heaters X, Y), and the third heater (the third heaters A to D) are deeper in proportion to the depths of the associated heaters. For this reason, there is no jumper extending in the thickness direction of the ceramic base, so manufacturing is easy.

Furthermore, since each of the jumpers for the second heaters is extended from the side (coil lower part in the present embodiment) opposite from the wafer placement surface with respect to the coil center of the second heater, it is possible to increase a distance D1 (see FIG. 2) from the wafer placement surface to the jumpers, so influences due to heating of the jumper are reduced.

Moreover, since each of the jumpers for the third heaters is extended from the wafer placement surface side (coil upper part in the present embodiment) with respect to the coil center of the third heater, it is possible to increase a distance D2 (see FIG. 2) from the side opposite from the wafer placement surface of the ceramic base to the jumpers. With this configuration, the length of each hole for mounting a terminal is ensured.

Furthermore, the lengths of the rods that respectively supply electric power to the plurality of heaters and the RF electrode and extending from the shaft are even, so the structure of a rod receiving side can be simplified.

It is needless to say that the present invention is not limited by the foregoing embodiment and can be implemented in various aspects without departing from the technical scope of the present invention.

The present application claims priority from Japanese Patent Application No. 2021-017029, filed on Feb. 5, 2021, the entire contents of which are incorporated herein by reference.

What is claimed is:

1. A wafer support table comprising:
a ceramic base having a wafer placement surface; and
a plurality of heaters embedded in the ceramic base, wherein
the ceramic base has a first heater formation surface, a second heater formation surface, and a third heater formation surface in a stated order from the wafer placement surface toward a surface opposite from the wafer placement surface,
the plurality of heaters includes a first heater provided on the first heater formation surface, a second heater provided on the second heater formation surface, and a third heater provided on the third heater formation surface,
the first heater is provided so as to be located at a center of the ceramic base,
the second heater is provided so as to be located around a periphery of the first heater, and
the third heater is provided so as to overlap the second heater and is provided in each of a plurality of zones divided from the third heater formation surface by a radial line segment, and
wherein the first heater, the second heater, and the third heater each have a coil shape, and a second heater jumper is connected to a surface side opposite from the wafer placement surface with respect to a coil center of the second heater, and a third heater jumper is connected to a side closer to the wafer placement surface with respect to a coil center of the third heater,
wherein the second heater jumper is not electrically connected to the third heater jumper, and
wherein a distance from the third heater jumper to the surface side opposite from the wafer placement surface is greater than a distance from the second heater jumper to the wafer placement surface.

2. The wafer support table according to claim 1, wherein the second heater jumper is provided on the second heater formation surface, and the third heater jumper is provided on the third heater formation surface.

3. The wafer support table according to claim 1, wherein terminal holes for respectively supplying electricity to the first heater, the second heater, and the third heater get deeper in proportion to depths of the associated heaters.

4. The wafer support table according to claim 1, wherein the ceramic base has an RF electrode disposed closer to the wafer placement surface than the plurality of heaters and has a cylindrical shaft on the surface opposite from the wafer placement surface, and a rod that supplies electricity to the first heater, a rod that supplies electricity to the second heater, a rod that supplies electricity to the third heater, and a rod connected to the RF electrode respectively have parts protruding from the shaft with the same length.

5. The wafer support table according to claim 1, wherein the second heater is provided in each of a plurality of zones divided from the second heater formation surface by a boundary concentric with the ceramic base.

\* \* \* \* \*